United States Patent
Lee et al.

(10) Patent No.: US 12,009,422 B2
(45) Date of Patent: Jun. 11, 2024

(54) SELF ALIGNED TOP CONTACT FOR VERTICAL TRANSISTOR

(71) Applicant: INTERNATIONAL BUSINESS MACHINES CORPORATION, Armonk, NY (US)

(72) Inventors: ChoongHyun Lee, Chigasaki (JP); Christopher J. Waskiewicz, Rexford, NY (US); Chanro Park, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 17/453,874

(22) Filed: Nov. 8, 2021

(65) Prior Publication Data

US 2023/0144407 A1    May 11, 2023

(51) Int. Cl.
*H01L 29/78* (2006.01)
*H01L 29/417* (2006.01)
*H01L 29/66* (2006.01)

(52) U.S. Cl.
CPC .... *H01L 29/7827* (2013.01); *H01L 29/41775* (2013.01); *H01L 29/66666* (2013.01)

(58) Field of Classification Search
CPC ........... H01L 29/7827; H01L 29/41775; H01L 29/66666; H01L 29/0847; H01L 29/41741
USPC ........................................................ 257/329
See application file for complete search history.

(56) References Cited

U.S. PATENT DOCUMENTS

| | | | |
|---|---|---|---|
| 9,093,304 B2 | 7/2015 | Koldiaev | |
| 9,825,032 B1 | 11/2017 | Bentley | |
| 9,954,529 B2 | 4/2018 | Anderson | |
| 10,056,377 B2 | 8/2018 | Bentley | |
| 10,109,637 B1 | 10/2018 | Zang | |
| 10,483,361 B1 | 11/2019 | Lee | |
| 10,529,724 B2 | 1/2020 | Zang | |
| 2018/0068904 A1* | 3/2018 | Adusumilli | H01L 29/78696 |
| 2019/0334014 A1 | 10/2019 | Ching | |
| 2019/0355729 A1 | 11/2019 | Liaw | |
| 2020/0075737 A1* | 3/2020 | Lee | H01L 29/45 |

(Continued)

FOREIGN PATENT DOCUMENTS

| | | |
|---|---|---|
| WO | 2009128450 A1 | 10/2009 |
| WO | 2023079504 A1 | 5/2023 |

OTHER PUBLICATIONS

Notification of Transmittal of the International Search Report and the Written Opinion of the International Searching Authority, or the Declaration, Date of mailing Feb. 9, 2023, Applicant's or agent's file reference P201904308PCT01, International application No. PCT/IB2022/060632, 12 pages.

(Continued)

*Primary Examiner* — Mohammad M Hoque
(74) *Attorney, Agent, or Firm* — L. Jeffrey Kelly

(57) ABSTRACT

A semiconductor structure including a bottom source drain region arranged on a substrate; a semiconductor channel region extending vertically upwards from a top surface of the bottom source drain region; a metal gate disposed around the semiconductor channel region; a top source drain region above the semiconductor channel region; and a top contact partially embedded into the top source drain region.

20 Claims, 13 Drawing Sheets

(56) References Cited

U.S. PATENT DOCUMENTS

2020/0091317 A1* 3/2020 Cheng .................. H01L 21/324

OTHER PUBLICATIONS

Kawasaki et al., "Challenges and Solutions of FinFET Integration in an SRAM Cell and a Logic Circuit for 22 nm node and beyond", Conference Paper in Electron Devices Meeting, 1988, IEDM '88. Technical Digest., International—Jan. 2010, 4 pages.

Radamson et al., "The Challenges of Advanced CMOS Process from 2D to 3D", applied sciences, Appl. Sci. 2017, 7, 1047, 32 pages.

* cited by examiner

SELF ALIGNED TOP CONTACT FOR VERTICAL TRANSISTOR

BACKGROUND

The present invention generally relates to semiconductor structures, and more particularly to a self-aligned top contact for a vertical transistor.

Vertical transistors are an attractive option for technology scaling for 5 nm and beyond technologies. Vertical transistors have a channel oriented perpendicular to the substrate surface, as opposed to being situated along the plane of the surface of the substrate in the case of a lateral transistor. By using a vertical design, it is possible to increase packing density. That is, by having the channel perpendicular to the substrate, vertical transistors improve the scaling limit beyond lateral transistors.

SUMMARY

According to an embodiment of the present invention, a semiconductor structure is provided. The semiconductor structure may include a bottom source drain region arranged on a substrate; a semiconductor channel region extending vertically upwards from a top surface of the bottom source drain region; a metal gate disposed around the semiconductor channel region; a top source drain region above the semiconductor channel region; and a top contact partially embedded into the top source drain region.

According to another embodiment, a semiconductor structure is provided. The semiconductor structure may include bottom source drain region arranged on a substrate; a semiconductor channel region extending vertically upwards from a top surface of the bottom source drain region; a metal gate disposed around the semiconductor channel region; a top source drain region above the semiconductor channel region; a top contact partially embedded into the top source drain region; and a gate liner separating the metal gate and the top source drain from an interlevel dielectric layer, wherein an uppermost surface of the gate liner is substantially flush with an uppermost surface of the top source drain region.

According to another embodiment, a method is provided. The method may include forming a bottom source drain region arranged on a substrate; forming a semiconductor channel region extending vertically upwards from a top surface of the bottom source drain region; forming a metal gate disposed around the semiconductor channel region; forming a top source drain region above the semiconductor channel region; and forming a top contact partially embedded into the top source drain region.

BRIEF DESCRIPTION OF THE DRAWINGS

The following detailed description, given by way of example and not intended to limit the invention solely thereto, will best be appreciated in conjunction with the accompanying drawings, in which.

Figure 1:
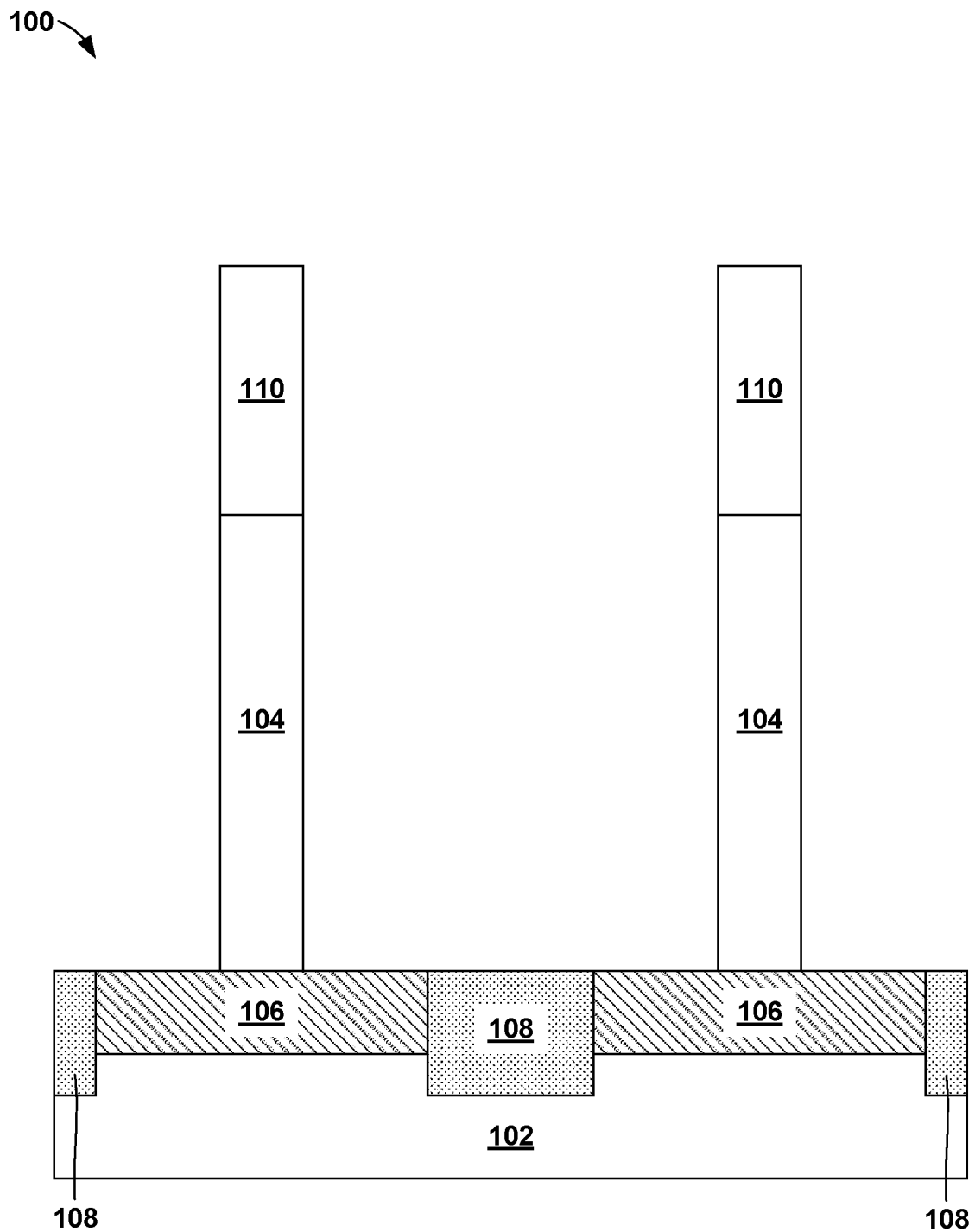
FIG. 1 is a cross-sectional view of a semiconductor structure during an intermediate step of a method of fabricating a vertical transistor with a self-aligned top contact according to an exemplary embodiment.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Vertical transport FETs (VTFET) have known advantages over conventional FinFETs in terms of density, performance, power consumption, and integration. However, device performance of VTFET is limited by resistance at the top source drain due to limited contact area between the relatively small top source drain epi and the metal top contact. Current lithographic patterning edge accuracy cannot offer the process margins for metal top contacts in a tight pitch designs, for example SRAM devices where distance between nFET to pFET is only 30 nm. Metal top contacts along the fin have to be smaller than the fin to avoid electrical shorts between neighboring nFET and pFET.

Embodiments of the present disclose a VTFET with a self-aligned wrap-around-contact architecture to reduce the resistance and to improve VTFET performance. The self-aligned wrap-around-contact architecture proposed herein increases the contact area between the top source drain epi and the metal top contact.

The present invention generally relates to semiconductor structures, and more particularly to a self-aligned top contact for a vertical transistor. More specifically, the self-aligned wrap-around contact disclosed herein reduces resistance between the top source drain region and the metal top contact of the vertical transistor by increasing the contact area between the top source drain region and the contact.

Embodiments of the present invention propose increasing the contact area between the top source drain region and the contact at least 1.5-2 times that of conventional vertical transistor structures. Lowering the resistance will in turn increase device performance. The top source drain region of the proposed structure is self-aligned to further maximize the contact area between the top source drain region and the contact. The self-aligned top source drain metal contact proposed herein allows for full use of the fin length while eliminating any risk of electrical short between nFET and pFET in tight pitch configurations. Exemplary embodiments of a wrap-around contact for a vertical transistor are described in detail below by referring to the accompanying drawings in FIGS. 1 to 13. Those skilled in the art will readily appreciate that the detailed description given herein with respect to these figures is for explanatory purposes as the invention extends beyond these limited embodiments.

Referring now to FIG. 1, a structure 100 is shown during an intermediate step of a method of fabricating a vertical transistor with a self-aligned top metal contact according to an embodiment of the invention. The structure 100 illustrated in FIG. 1 includes a semiconductor substrate 102 (hereinafter "substrate"), semiconductor fins 104, bottom source drain regions 106, and shallow trench isolation regions 108 (hereinafter "STI regions") formed thereon.

The substrate 102 is shown and may be formed from any appropriate material including, e.g., bulk semiconductor or a semiconductor-on-insulator layered structure. Illustrative examples of suitable materials for the substrate 102 include, but are not limited to, silicon, silicon germanium, carbon doped silicon germanium, carbon doped silicon, epitaxial silicon, and multi-layers thereof. Although silicon is the predominantly used semiconductor material in wafer fabrication, alternative semiconductor materials can be employed, such as, but not limited to, gallium arsenide, indium phosphide, indium gallium arsenide, indium arsenide, gallium, cadmium telluride and zinc selenide.

In the present embodiment, the substrate 102 is a bulk semiconductor substrate. By "bulk" it is meant that the semiconductor substrate 102 is entirely composed of at least one of the above materials listed above. In an embodiment, the substrate 102 can be entirely composed of silicon. In other embodiments, the semiconductor substrate 102 may include a multilayered semiconductor material stack including at least two different semiconductor materials, as defined above. In an embodiment, the multilayered semiconductor material stack may include, in any order, a stack of silicon and a silicon germanium alloy. In another embodiment, the semiconductor substrate 102 may include a single crystalline semiconductor material. Such single crystal materials may have any of the well-known crystal orientations. For example, the crystal orientation of the semiconductor substrate 102 may be {100}, {110}, or {111}. Other crystallographic orientations besides those specifically mentioned can also be used in the present application.

The semiconductor fins 104 are formed from a semiconductor layer (not shown), and form the channel region of the vertical transistor device depicted by the structure 100. First, masks 110 are deposited on the semiconductor layer. The masks 110 define regions for the semiconductor fins 104. The semiconductor layer is etched or patterned using an anisotropic etch such as, for example, reactive ion etching, to remove material that is not covered by the masks 110 to form the semiconductor fins 104. Although the present application describes and illustrates forming two semiconductor fins 104, the same process may be used to form a single semiconductor fin, or more than two semiconductor fins.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In an embodiment, each semiconductor fin 104 has a height ranging from approximately 20 nm to approximately 200 nm, and a width ranging from approximately 5 nm to approximately 30 nm. Other heights and/or widths that are lesser than, or greater than, the ranges mentioned herein can also be used in the present application. Each semiconductor fin 104 is spaced apart from its nearest neighboring semiconductor fin 104 by a pitch ranging from approximately 20 nm to approximately 100 nm; the pitch is measured from one point, or reference surface, of one semiconductor fin to the exact same point, or reference surface, on a neighboring semiconductor fin. Also, the semiconductor fins 104 are generally oriented parallel to each other. Each semiconductor fin 104 extends upward from a top surface of the bottom source drain regions 106.

In general, the bottom source drain regions 106 are arranged on the substrate 102. Specifically, in the illustrated embodiment, the bottom source drain regions 106 are epitaxially grown within trenches or recesses formed in the substrate 102. In other embodiments, the bottom source drain regions 106 are epitaxially grown directly on top of the substrate 102 adjacent to the semiconductor fins 104 and subsequently patterned, if needed. In yet another embodiment, the bottom source drain regions 106 are formed by doping an exposed surface of the substrate 102 using an ion implant technique.

It should be understood that the bottom source drain regions 106 may be either one of a source region or a drain region, as appropriate. Illustrative examples of suitable materials for the bottom source drain regions 106 include, but are not limited to, silicon, silicon germanium, carbon doped silicon germanium, and multi-layers thereof.

The bottom source drain regions 106 may be doped with dopant atoms. The bottom source drain regions 106 may be in-situ doped as they are grown or deposited on the substrate 102. The dopant atoms may be an n-type dopant or a p-type dopant. Exemplary n-type dopants include phosphorus, arsenic antimony for group IV semiconductors, and selenium, tellurium, silicon, and germanium for III-V semiconductors. Exemplary p-type dopants include beryllium, zinc, cadmium, silicon, germanium, for III-V semiconductors, and boron, aluminum, and gallium for group IV semiconductors. In an embodiment, for group IV semiconductors based device, the bottom source drain regions 106 are made from doped Si: (for n-type devices) or SiGe:B (for p-type devices), with dopant concentrations ranging from approximately $2 \times 10^{20}$ to approximately $2.5 \times 10^{21}$ atoms/cm$^2$, with a dopant concentration ranging from approximately $4 \times 10^{20}$ to approximately $1.5 \times 10^{21}$ atoms/cm$^2$ being more typical.

In another embodiment, the bottom source drain regions 106 may be formed from a III-V semiconductor. The term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present embodiments include, but are not limited to, alloys of gallium arsenide, indium arsenide, indium antimonide, indium phosphide, aluminum arsenide, indium gallium arsenide, indium aluminum arsenide, indium aluminum arsenide antimonide, indium aluminum arsenide phoshorude, indium gallium arsenide phosphorude and combinations thereof. In an embodiment, the bottom source drain regions 106 are made from doped III-V semiconductor materials with dopant concentrations ranging from approximately $1 \times 10^{18}$ to approximately $1 \times 10^{20}$ atoms/cm2, with a dopant concentration ranging from approximately $5 \times 10^{18}$ to approximately $8 \times 10^{19}$ atoms/cm2 being more typical.

The STI regions 108 penetrate, or extend below, the bottom source drain regions 106 and extend partially into the substrate 102. As illustrated, trenches are formed by any appropriate technique, for example an anisotropic etch or machining. Next, the trenches are filled with a dielectric material to form the STI regions 108. The STI regions 108 may be formed from any appropriate dielectric including, for example, silicon oxide (SiO$_x$) or silicon nitride (Si$_x$N$_y$).

Figure 2:
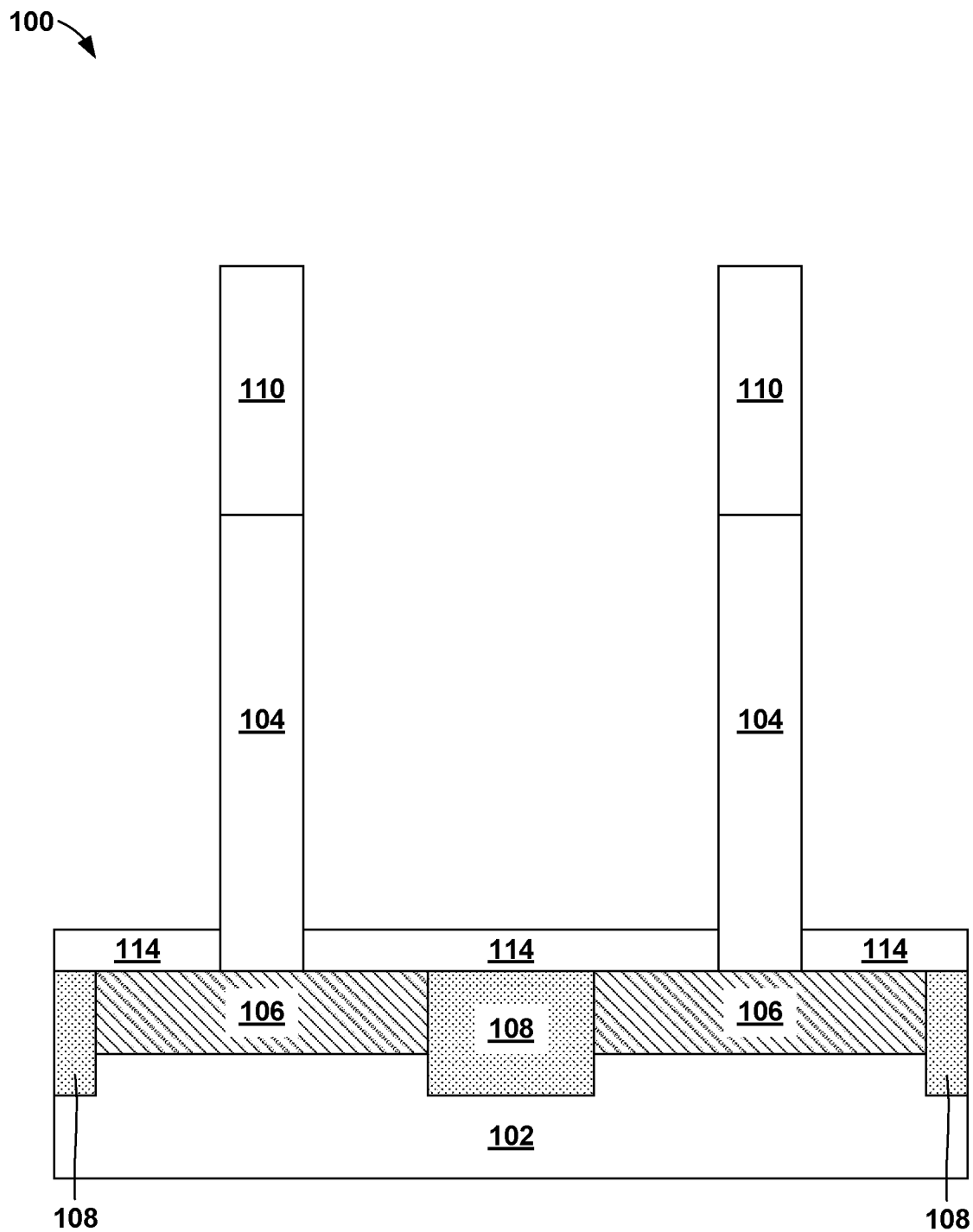
FIG. 2 is a cross-sectional view of the semiconductor structure after forming bottom spacers according to an exemplary embodiment.

Referring now to FIG. 2, the structure 100 is shown after forming bottom spacers 114 in accordance with an embodiment of the present invention. As is shown, the bottom spacers 114 contact sidewall surfaces of a lower portion of the at least one semiconductor fin 104. The bottom spacers 114 have a height, or thickness, that is less than a height of each semiconductor fin 104. Stated differently, topmost surfaces of the bottom spacers 114 are vertically offset and located far beneath topmost surfaces of each mask 110, and beneath topmost surfaces of the semiconductor fins 104.

In the illustrated embodiment, the bottom spacers 114 are deposited on a top surface of the bottom source drain regions 106. It is specifically contemplated that the bottom spacers 114 are deposited in an anisotropic manner, without accumulation on the sidewalls of the semiconductor fins 104. This may be accomplished using, for example, gas cluster ion beam (GCIB) deposition, where the surface is bombarded by high-energy cluster ions. In alternative embodiments, other deposition techniques may be used to form the bottom spacers 114 only on the horizontal surfaces.

Alternatively, the bottom spacers 114 are formed by first depositing a blanket dielectric layer followed by a recess etch to remove a portion of the blanket dielectric layer. The recess etch removes a portion of the blanket dielectric layer until the bottom spacers 114 remains. In such cases, the chosen dielectric material is etched selective to the masks 110 and the semiconductor fins 104. In an example, when the blanket dielectric layer is silicon oxide (SiO$_x$) and the masks 110 are silicon nitride (Si$_x$N$_y$), a hydrofluoric acid or a buffered oxide etchant (i.e., a mixture of ammonium fluoride and hydrofluoric acid) may be used during the recess etch technique.

Suitable spacer materials from which the bottom spacers 114 are formed include, but are not limited to, oxides such as silicon oxide (SiO$_x$), nitrides such as silicon nitride (Si$_x$N$_y$), and/or low-κ materials such as carbon-doped oxide materials containing silicon (Si), carbon (C), oxygen (O), and hydrogen (H) (SiCOH) or siliconborocarbonitride (SiBCN). The term "low-κ" as used herein refers to a material having a relative dielectric constant κ which is lower than that of silicon dioxide.

Figure 3:
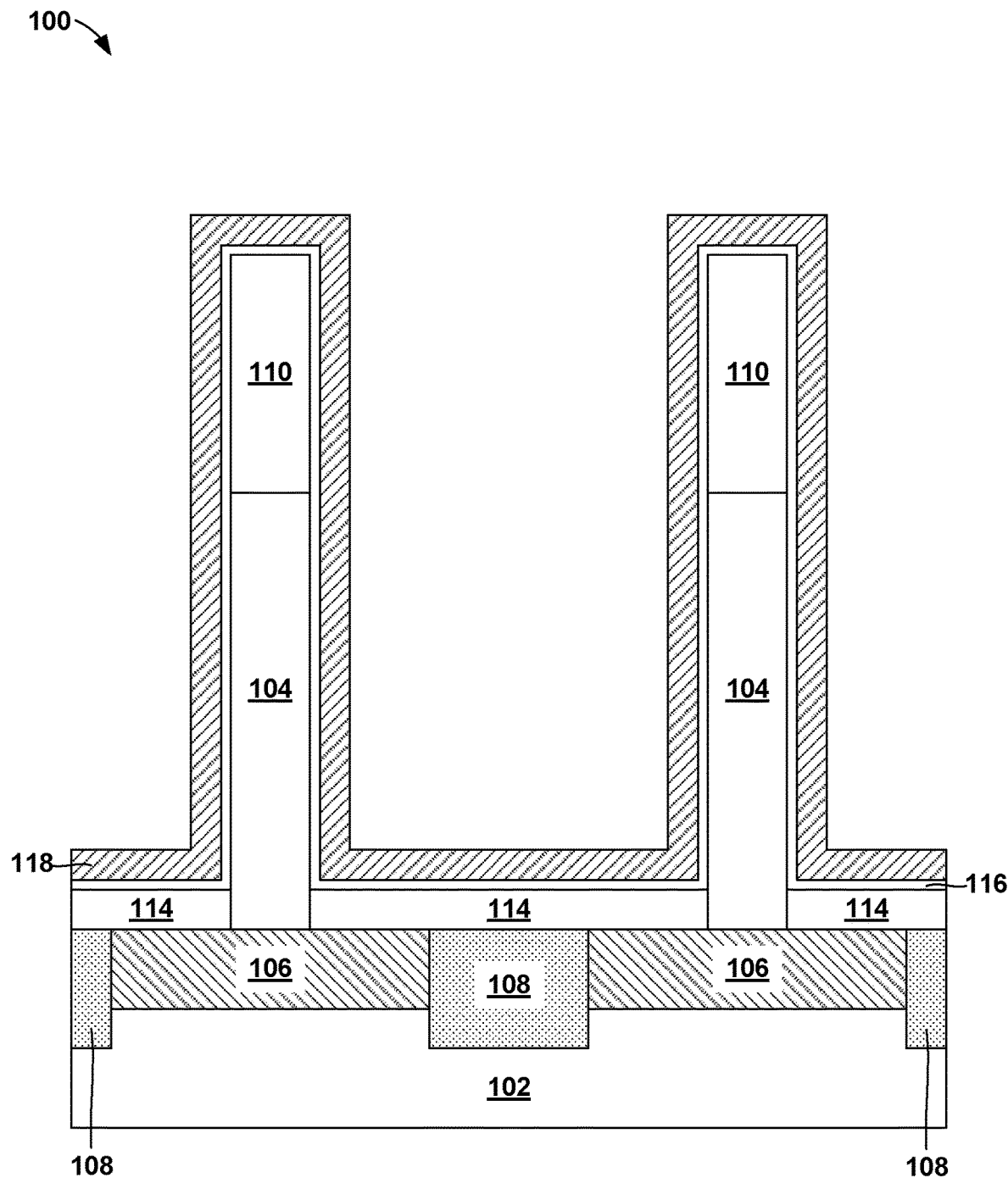
FIG. 3 is a cross-sectional view of the semiconductor structure after depositing a gate dielectric and metal gate according to an exemplary embodiment.

Referring now to FIG. 3, the structure 100 is shown after depositing a gate dielectric 116 and metal gate 118 in accordance with an embodiment of the present invention. In doing so, the gate dielectric 116 is conformally deposited directly on exposed surfaces of the fins 104, or channel, and the bottom spacers 114. By "conformal" it is meant that a material layer has a continuous thickness. For example, a continuous thickness generally means a first thickness as measured from a bottom surface to a topmost surface that is the same as a second thickness as measured from an inner sidewall surface to an outer sidewall surface. In another embodiment, the gate dielectric 116 may be a non-conformal layer.

The gate dielectric 116 is composed of a gate dielectric material. The gate dielectric 116 can be an oxide, nitride, and/or oxynitride. In an example, the gate dielectric 116 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure including different gate dielectric materials, e.g., silicon dioxide, and a high-k gate dielectric can be formed and used as the gate dielectric 116.

The gate dielectric 116 can be formed by any deposition technique including, for example, chemical vapor deposition (CVD), plasma enhanced chemical vapor deposition (PECVD), physical vapor deposition (PVD), sputtering, or atomic layer deposition. In an embodiment, the gate dielectric 116 can have a thickness in ranging from approximately 1 nm to approximately 10 nm. Other thicknesses that are lesser than, or greater than, the aforementioned thickness range can also be employed for the gate dielectric 116.

In an embodiment, the metal gate 118 is composed of an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In an embodiment, the work function of the n-type work function metal ranges from 4.1 eV to 4.3 eV. In an embodiment, the n-type work function metal is composed of at least one of TiAl, TaN, TiN, HfN, HfSi, or combinations thereof. The n-type work function metal can be formed using chemical vapor deposition atomic layer deposition, sputtering or plating.

In another embodiment, the metal gate 118 may be a p-type work function metal. As used herein, a "p-type work function metal" is a metal that effectuates a p-type threshold voltage shift. In an embodiment, the work function of the p-type work function metal ranges from 4.9 eV to 5.2 eV. As used herein, "threshold voltage" is the lowest attainable gate voltage that will turn on a semiconductor device, for example, transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In an embodiment, the p-type work function metal may be composed of titanium, titanium nitride or titanium carbide. The p-type work function metal may also be composed of TiAlN, Ru, Pt, Mo, Co and alloys and combinations thereof. In an embodiment, the p-type work function metal can be formed by, a physical vapor deposition method, such as sputtering, chemical vapor deposition or atomic layer deposition.

The metal gate 118 can be formed by any deposition technique including, for example, chemical vapor deposition (CVD), plasma enhanced chemical vapor deposition (PECVD), physical vapor deposition (PVD), sputtering, or atomic layer deposition. Like the gate dielectric 116, in some embodiments, the metal gate 118 is also a conformal layer. In an embodiment, the metal gate 118 can have a thickness in a ranging from approximately 1 nm to approximately 10 nm. Other thicknesses that are lesser than, or greater than, the aforementioned thickness range can also be employed for the used in providing the metal gate 118. It is critical to monitor and control forming of the metal gate 118 to prevent pinch off between adjacent devices, especially, in narrow-pitch configurations. As illustrated, the bottom spacers 114 separate the bottom source drain regions 106 from the metal gate 118.

Figure 4:
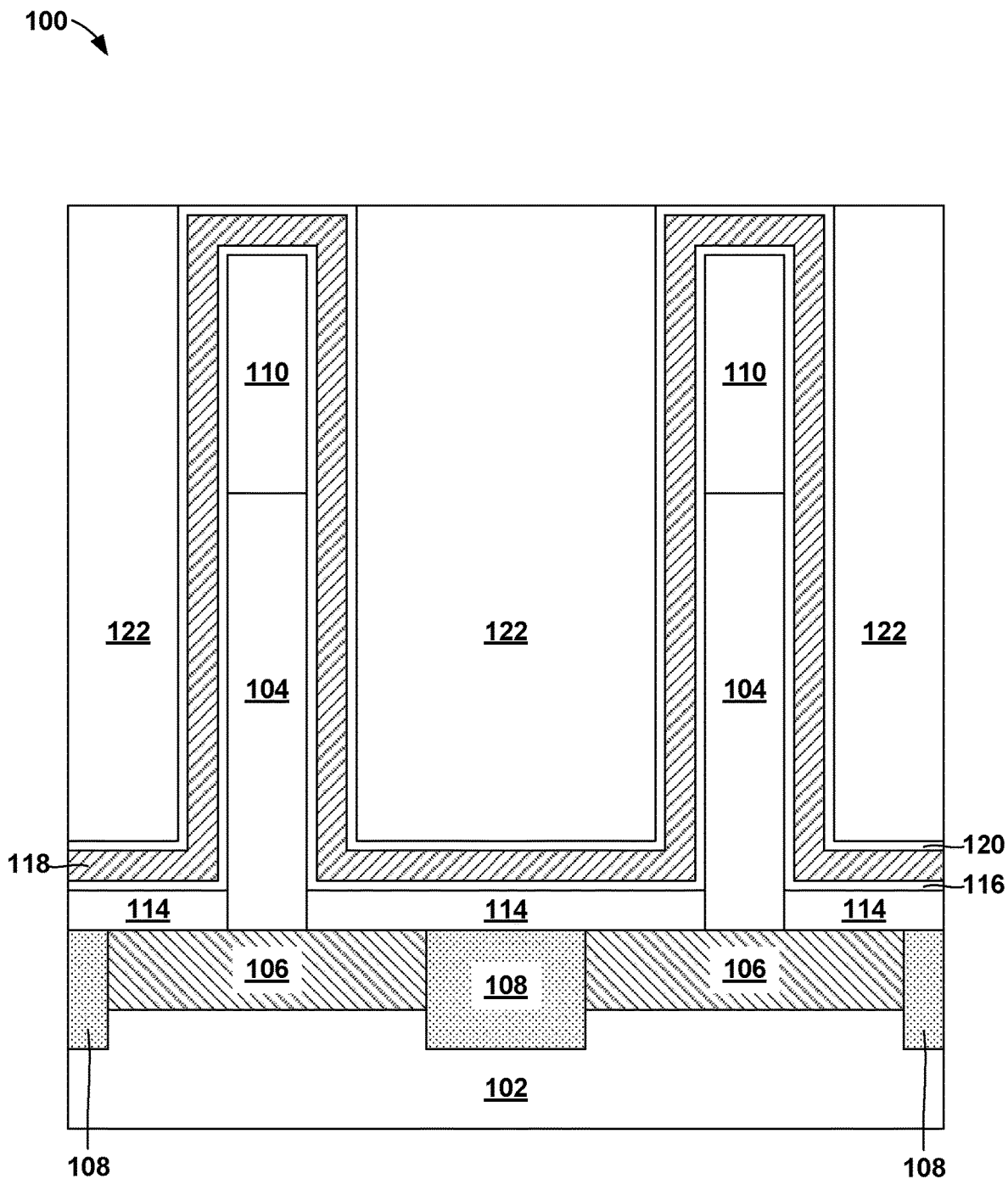
FIG. 4 is a cross-sectional view of the semiconductor structure after forming a gate liner according to an exemplary embodiment.

Referring now to FIG. 4, the structure 100 is shown after forming a gate liner 120 and an interlevel dielectric layer 122 are formed in accordance with an embodiment of the present invention. In doing so, the gate liner 120 is conformally deposited directly on exposed surfaces of metal gate 118. The gate liner 120 serves as an etch stop and is composed of known etch selective dielectric materials. The gate liner 120 can be any appropriate oxide, nitride, and/or oxynitride. In the present embodiment, the gate liner 120 should be any dielectric material capable of being selectively removed relative to the metal gate 118 and the interlevel dielectric layer 122. For example, the gate liner 120 of the present embodiment can be made from a nitride, such as, for example, silicon nitride or SiBCN, which can be etched or removed selective to the metal gate 118 and the interlevel dielectric layer 122.

The gate liner 120 can be formed by any suitable deposition technique including, for example, chemical vapor deposition (CVD), plasma enhanced chemical vapor deposition (PECVD), physical vapor deposition (PVD), sputtering, or atomic layer deposition. In general, the gate liner 120 should be thick enough to provide the requisite etch stop function. In an embodiment, the gate liner 120 can have a thickness in ranging from approximately 1 nm to approximately 10 nm. Other thicknesses that are lesser than, or greater than, the aforementioned thickness range can also be employed for the gate liner 120.

The interlevel dielectric layer 122 surrounds the structure shown in FIG. 14. The interlevel dielectric layer 122 is composed of any dielectric material that is different, in terms of composition and etch rate, than the dielectric materials of the gate liner 120. The interlevel dielectric layer 122 may be composed of, for example, silicon oxide ($SiO_x$), undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. As indicated above, the term "low-κ" as used herein refers to a material having a relative dielectric constant κ which is lower than that of silicon dioxide.

In an embodiment, the interlevel dielectric layer 122 can be formed using a deposition technique including, for example, chemical vapor deposition (CVD), plasma enhanced chemical vapor deposition (PECVD), physical vapor deposition (PVD), atomic layer deposition (ALD), evaporation, spin-on coating, or sputtering. After deposition, a planarization technique such as, for example, chemical mechanical planarization (CMP) and/or grinding is applied. The planarization technique removes excess material of the interlevel dielectric layer 122 and continues polishing until the uppermost surfaces of the gate liner 120 are exposed.

After polishing the uppermost surfaces of the gate liner 120 are flush, or substantially flush, with an uppermost surface of the interlevel dielectric layer 22. In another embodiment, interlevel dielectric layer 122 may include a self-planarizing material such as a spin-on glass (SOG) or a spin-on low-κ dielectric material such as SiLK™. Doing so may avoid the need to perform a subsequent planarizing step.

Figure 5:
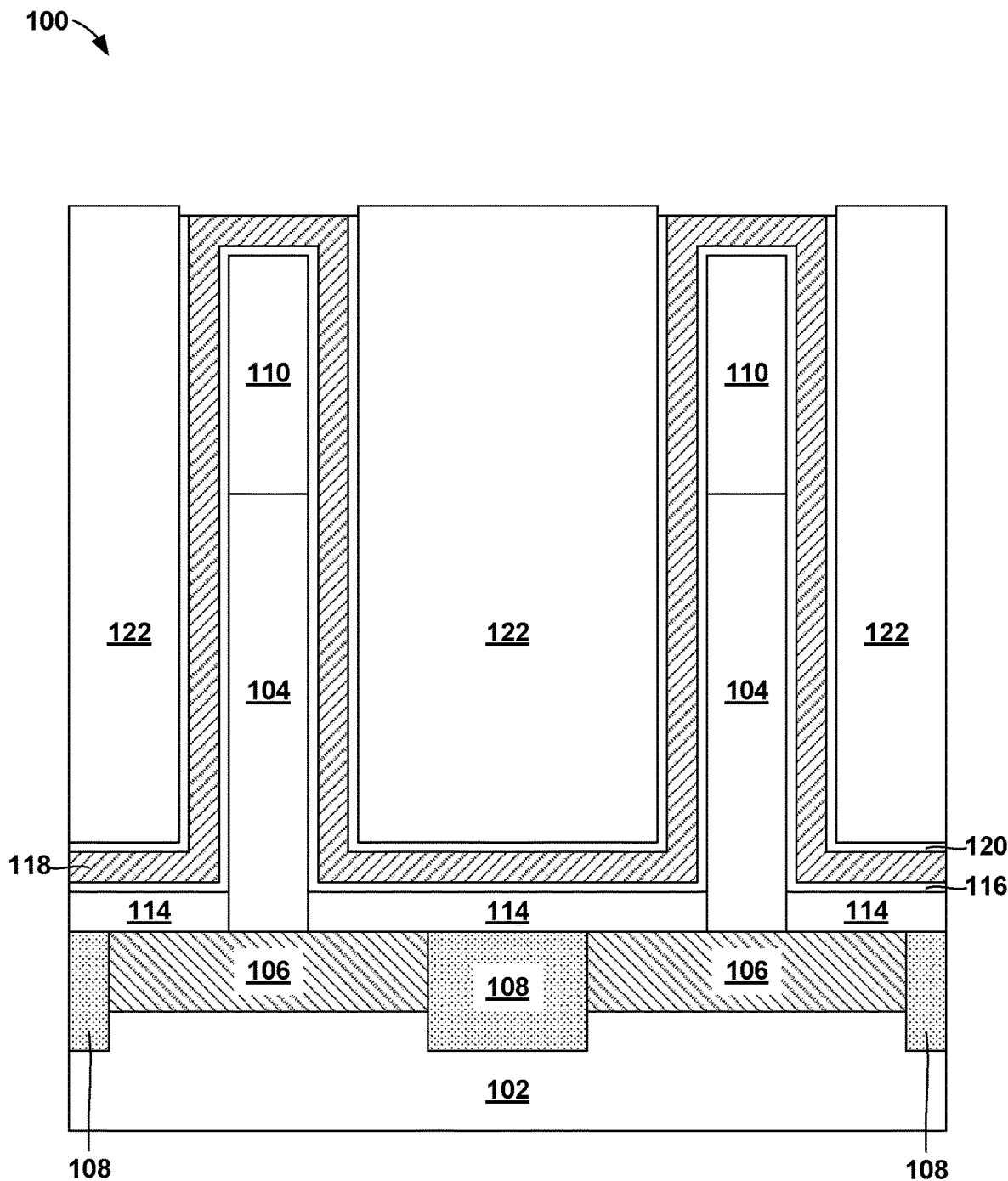
FIG. 5 is a cross-sectional view of the semiconductor structure after removing portions of the gate liner according to an exemplary embodiment.

Referring now to FIG. 5, the structure 100 is shown after removing portions of the gate liner 120 in accordance with an embodiment of the present invention. More specifically, the gate liner 120 is recessed to expose top portions of the metal gate 118. The gate liner 120 is recessed or etched selective to the metal gate 118 and the interlevel dielectric layer 122. The gate liner 120 can be recessed using any suitable method, such as a wet etch, a dry etch, or a combination of sequential wet and/or dry etches.

Figure 6:
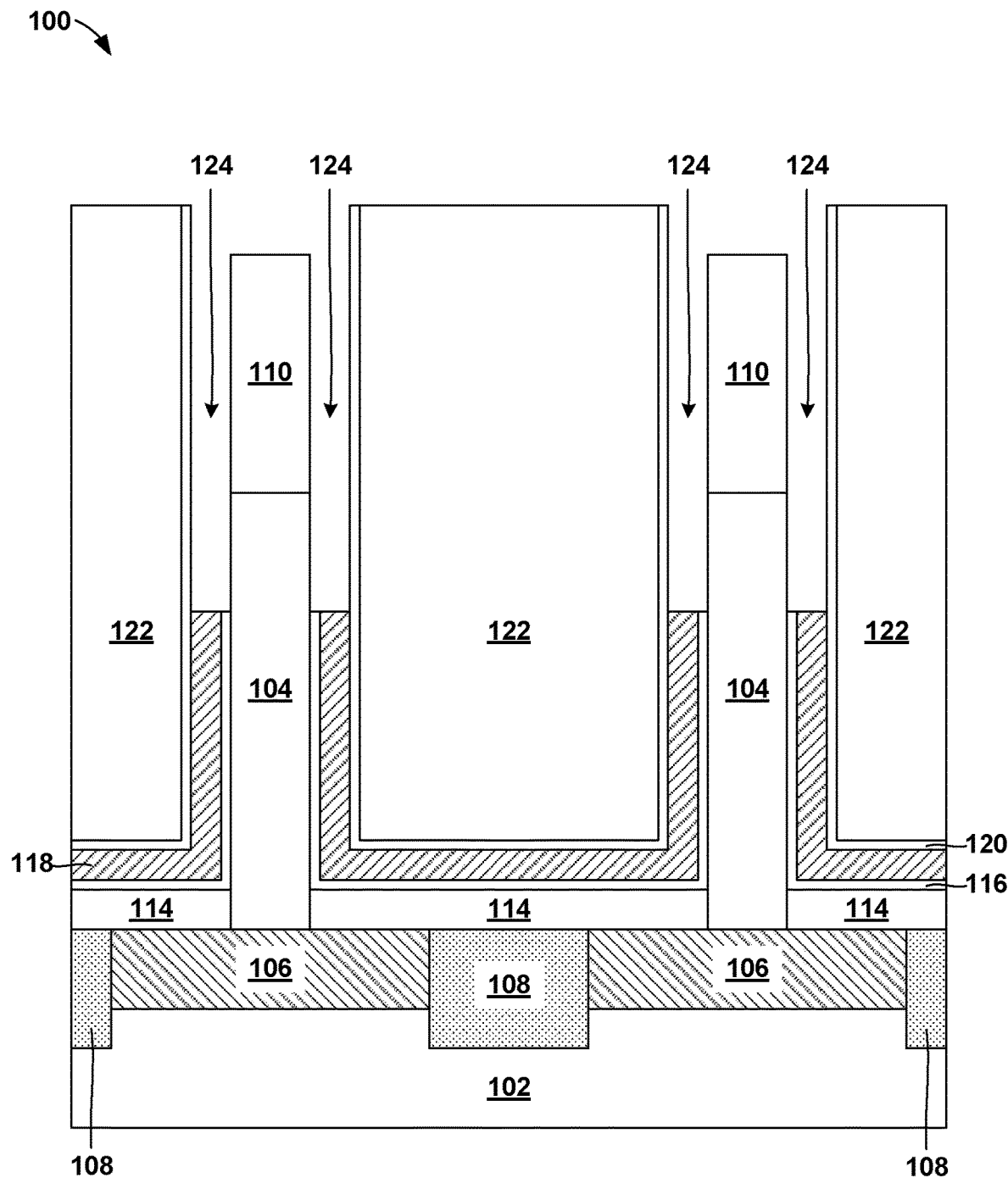
FIG. 6 is a cross-sectional view of the semiconductor structure after recessing the metal gate and the gate dielectric according to an exemplary embodiment.

Referring now to FIG. 6, the structure 100 is shown after recessing the metal gate 118 and the gate dielectric 116 in accordance with an embodiment of the present invention. More specifically, the metal gate 118 and the gate dielectric 116 are recessed to expose top portions of the semiconductor fins 104. The metal gate 118 and the gate dielectric 116 are recessed or etched selective to the gate liner 120 and the interlevel dielectric layer 122, and the masks 110.

The metal gate 118 and the gate dielectric 116 can be recessed using any suitable method, such as a wet etch, a dry etch, or a combination of sequential wet and/or dry etches. In an embodiment, the metal gate 118 and the gate dielectric 116 could be recessed using an anisotropic etch such as, for example, reactive ion etching. Alternatively, a wet etching technique may be used to recess the metal gate 118 and the gate dielectric 116.

Etching will would remove top portions of the metal gate 118 and the gate dielectric 116, and create an opening 124, or space, between the semiconductor fins 104 and the gate liner 120, as illustrated. After etching, upper surfaces of the metal gate 118 and the gate dielectric 116 will be below an upper surface of the semiconductor fins 104.

It is critical that the metal gate 118 and the gate dielectric 116 are recessed below an upper surface of the semiconductor fins 104 to ensure isolation between gate metal and the top source drain (See FIG. 12). If the metal gate 118 and the gate dielectric 116 are not recessed below the top surface of the semiconductor fins 104, a later formed source drain epitaxy may contact the metal gate 118 and create a short. As such, controlling the recess depth of the metal gate 118 and the gate dielectric 116 below the tops of the semiconductor fins 104 will allow for accurate top junction definition as well as define the channel length.

Figure 7:
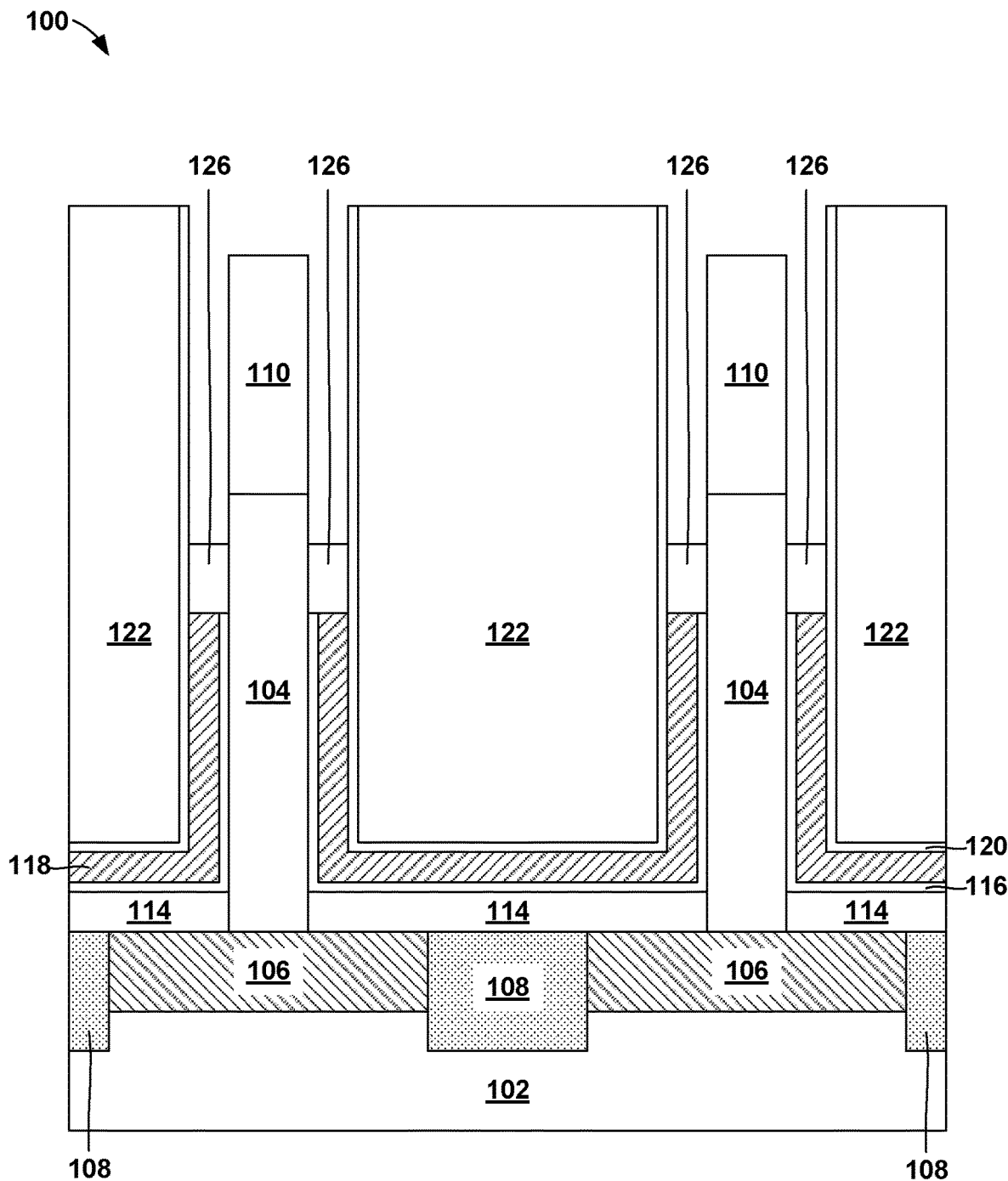
FIG. 7 is a cross-sectional view of the semiconductor structure after forming top spacers according to an exemplary embodiment.

Referring now to FIG. 7, the structure 100 is shown after forming top spacers 126 in accordance with an embodiment of the present invention. More specifically, the top spacers 126 may be formed directly on top of upper surfaces of the metal gate 118 and the gate dielectric 116 exposed by the prior recessing.

The top spacers 126 may be formed using a deposition technique followed by a spacer etch (anisotropic etch). For example, techniques for depositing the top spacers 126 include, for example, chemical vapor deposition (CVD), plasma enhanced chemical vapor deposition (PECVD), physical vapor deposition (PVD), atomic layer deposition (ALD), evaporation, spin-on coating, or sputtering. For example, techniques for etching the top spacers 126 include dry etching techniques, such as, for example, reactive ion etching, ion beam etching, plasma etching or laser ablation. The top spacers 126 are composed of any dielectric material that is similar, in terms of composition and etch rate, to the bottom spacers 114 described above.

Figure 8:
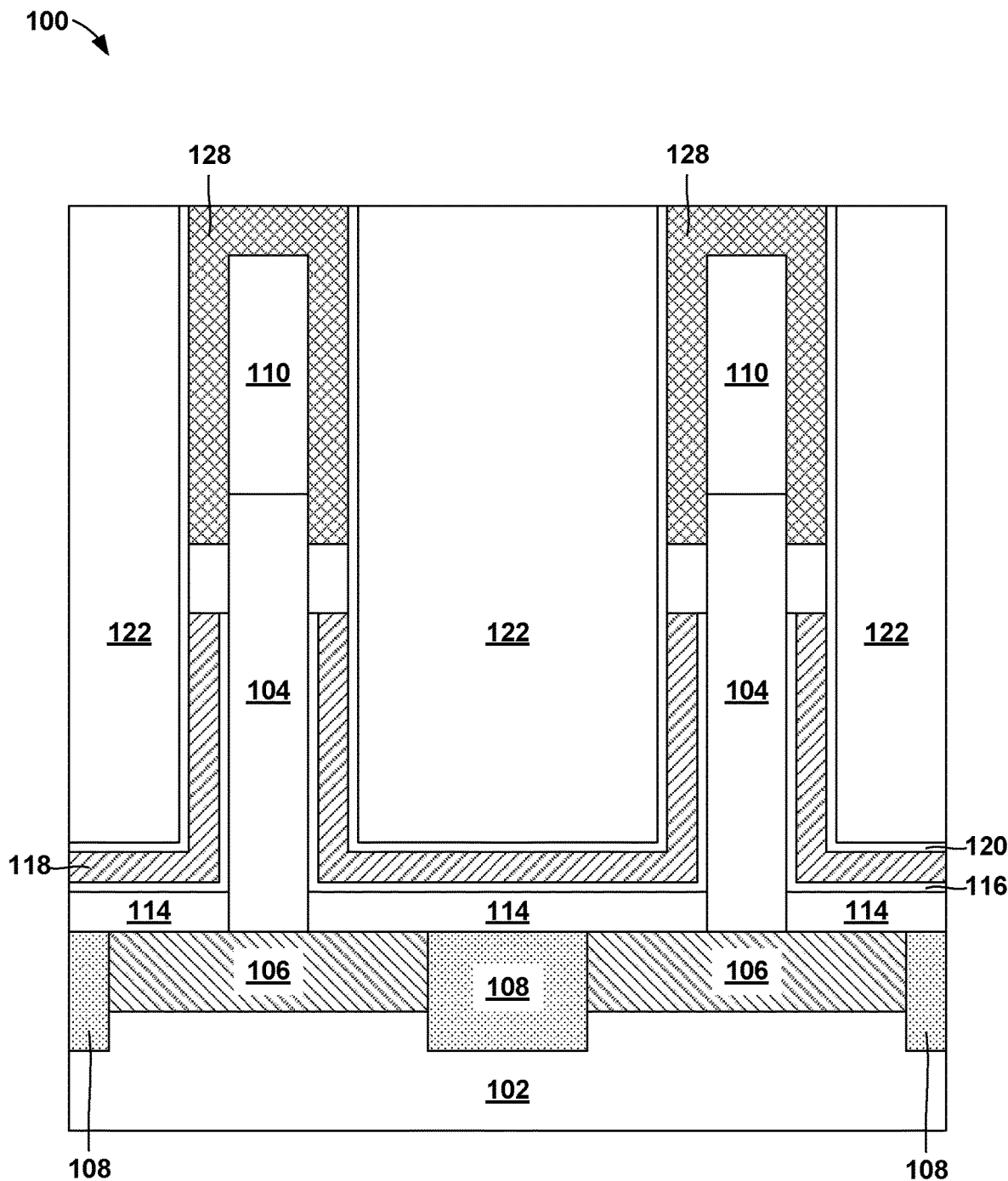
FIG. 8 is a cross-sectional view of the semiconductor structure after forming top source drain regions according to an exemplary embodiment.

Referring now to FIG. 8, the structure 100 is shown after forming top source drain regions 128 in accordance with an embodiment of the present invention. The top source drain regions 128 are formed directly on the top spacers 126, within the opening 124. As such, the top source drain regions 128 directly contact exposed top sidewall portions of the semiconductor fins 104 of the semiconductor fins 104, the top spacers 126 separate and isolate the top source drain regions 128 from the metal gate 118, and the gate liner 120 separates the top source drain regions 128 from the interlevel dielectric layer 122. Of note, a bottom surface of each top source drain region 128 is below a top surface of each semiconductor fin 104.

The top source drain regions 128 can be epitaxially grown from exposed sidewalls of the semiconductor fins 104 using conventional techniques similar to the bottom source drain regions 106. Additionally, the top source drain regions 128 can be formed from similar materials and similar dopant concentrations as bottom source drain regions 106. In the present embodiment, the top source drain regions 128 should be grown to completely fill the opening 124. In the present application, it should be noted the top source drain regions 128 are grown directly from exposed sidewalls of each semiconductor fin 104 and cover the masks 110, whereas conventional techniques would normally remove the mask 110 prior to forming the top source drain regions 128. In this case, the masks 110 remain and function as a placeholder for subsequent processing. Additionally, the process may include overgrowing the top source drain regions 128 above a top surface of the interlevel dielectric layer 122, after which any excess material will be removed by a subsequent chemical mechanical planarization technique. At this stage of fabrication, the top source drain regions 128 does do not undergo a high temperature anneal in order to preserve the integrity of the metal gate 132 metal gate 118.

Figure 9:
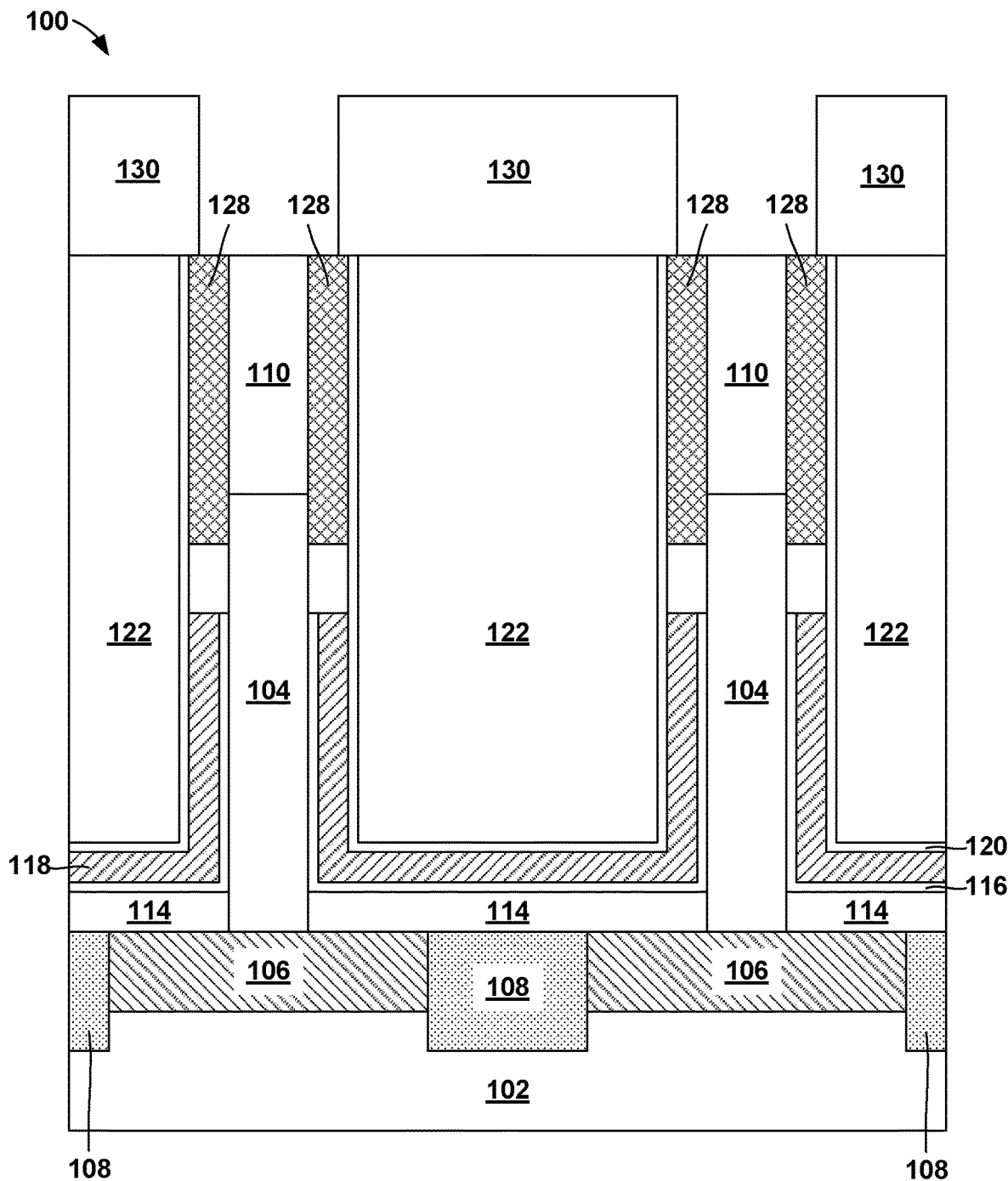
FIG. 9 is a cross-sectional view of the semiconductor structure after polishing and forming a planarization layer according to an exemplary embodiment.

Referring now to FIG. 9, the structure 100 is shown after polishing and forming a planarization layer 130 in accordance with an embodiment of the present invention.

After forming top source drain regions 128, a planarization technique such as, for example, chemical mechanical planarization and/or grinding is applied. The planarization technique removes any excess material of the top source drain regions 128 remaining on top of the interlevel dielectric layer 122. Polishing continues until the masks 110 are exposed. After polishing upper surfaces of the interlevel dielectric layer 122, gate liner 120, the top source drain regions 128, and the masks 110 are flush, or substantially flush, with each other.

Next, the planarization layer 130 is deposited and subsequently patterned to expose the masks 110. Patterning of the planarization layer 130 does not need to align with edges of the interlevel dielectric layer 122, the gate liner 120, or the top source drain regions 128, but instead must expose the masks 110 in preparation for their subsequent removal.

The planarization layer 130 can be an organic planarization layer (OPL) or a layer of material that is capable of being planarized or etched by known techniques. In an embodiment, for example, the planarization layer 130 can be an amorphous carbon layer able to withstand the high temperatures of subsequent processing steps. The planarization layer 130 can preferably have a thickness sufficient to cover existing structures. After deposition of the planarization layer 130, a dry etching technique is applied to pattern the planarization layer 130 and expose an uppermost surface of the masks 110.

Figure 10:
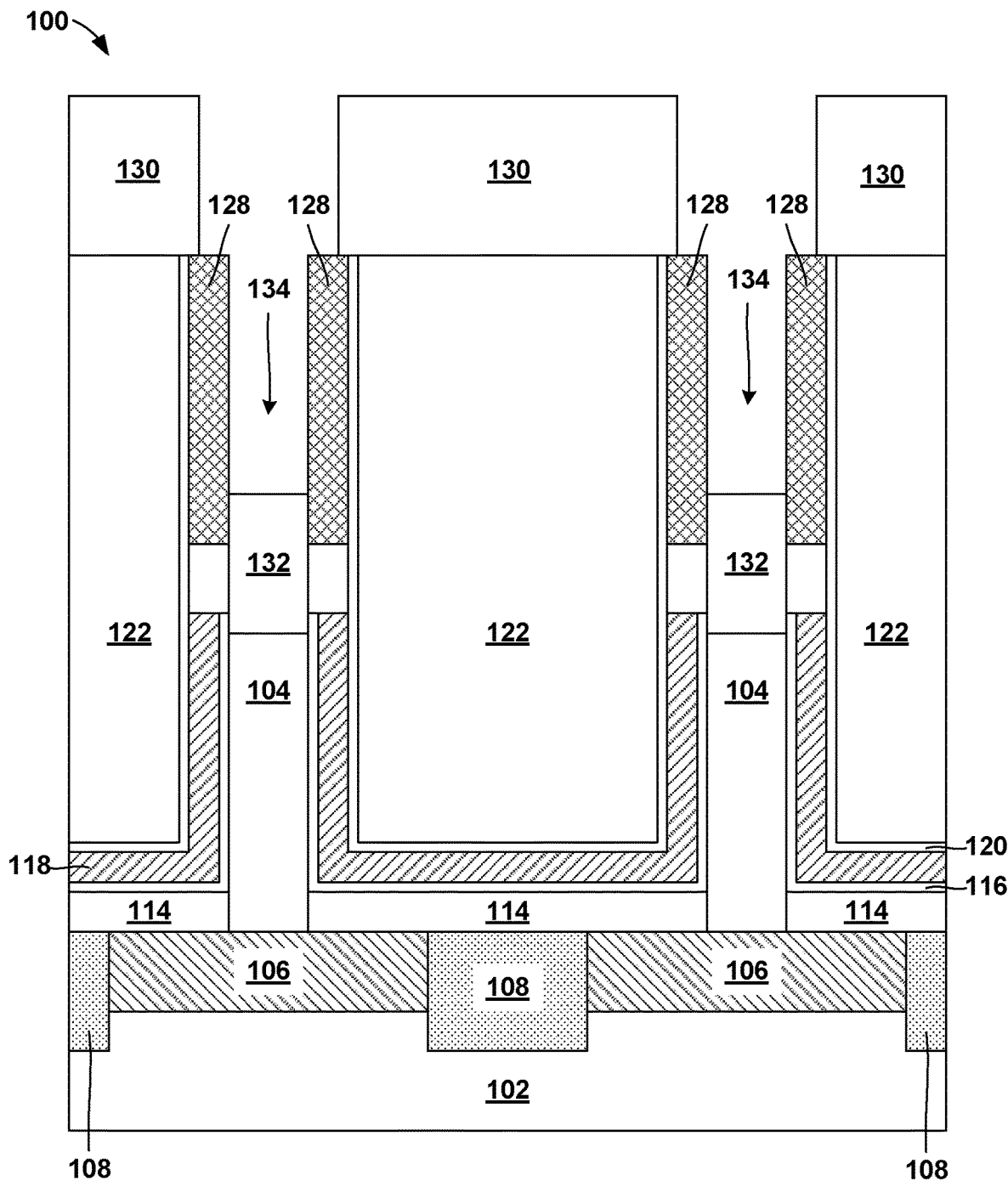
FIG. 10 is a cross-sectional view of the semiconductor structure after removing the masks and forming junctions according to an exemplary embodiment.

Referring now to FIG. 10, the structure 100 is shown after removing the masks 110 and forming junctions 132 in accordance with an embodiment of the present invention.

The masks 110 are removed using an etch selective to the top source drain regions 128 and the semiconductor fins 104. In an embodiment, when the masks 110 are composed of silicon nitride ($Si_xN_y$), a hot (around 150° C. to 180° C.) phosphoric acid solution may be used to remove the masks 110 selective to the planarization layer 130 and the top source drain regions 128. Removing the masks 110 creates an opening 134 and exposes topmost surfaces of the semiconductor fins 104.

After the masks 110 are removed, an ion implant technique and thermal process are performed to form the junction 132. First, the semiconductor fins 104 are doped with dopant atoms using an implantation technique in a similar fashion as described above with respect to forming the bottom source drain regions 106. Like above, the dopant atoms may be an n-type dopant or a p-type dopant. Exemplary n-type dopants include phosphorus, arsenic antimony, selenium, tellurium, silicon, and germanium. Exemplary p-type dopants include beryllium, zinc, cadmium, silicon, germanium, boron, aluminum, and gallium. Typically, both the bottom source drain regions 106 and the junction 132 will be doped with the same type dopants.

Second, a thermal process is used to diffuse the implanted dopants into the semiconductor fin 104, or top of the channel, to form the junction 132. In some cases, dopants from the top source drain regions 128 may also diffuse into the semiconductor fin 104 and contribute to formation of the junction 132. In at least one embodiment, the thermal process may include a high temperature spike anneal, or a laser spike anneal. Finally, the planarization layer 130 is removed using known techniques, for example, by ashing.

Figure 11:
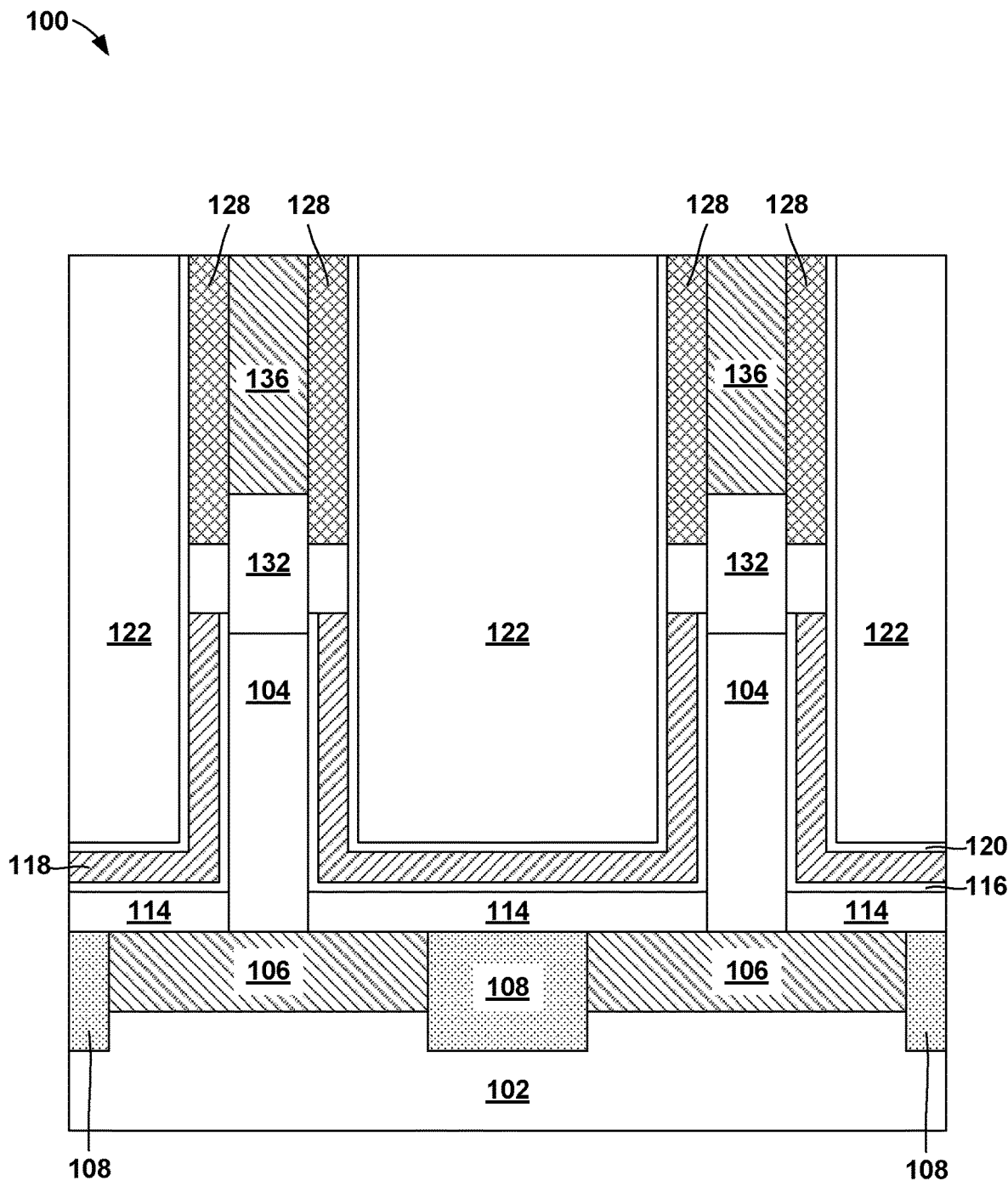
FIG. 11 is a cross-sectional view of the semiconductor structure after forming top contact metal according to an exemplary embodiment.

Referring now to FIG. 11, the structure 100 is shown after forming top contact metal 136 in the opening and on topmost surfaces of the semiconductor fins 104 in accordance with an embodiment of the present invention. The openings 134 are filled with a conductive material to form the top contact metal 136. For example, each top contact metal (136) is surrounded by each top source drain region (128) and directly contacts a top surface of the semiconductor channel region.

The top contact metal 136 can be formed by depositing a conductive material in the openings 134. The top contact metal 136 may include any suitable conductive material, such as, for example, copper, aluminum, tungsten, cobalt, or alloys thereof. Examples of deposition techniques that can be used in providing the spacer material include, for example, chemical vapor deposition (CVD), plasma enhanced chemical vapor deposition (PECVD), or atomic layer deposition (ALD). In some cases, an electroplating technique can be used to form the top contact metal 136.

After deposition, a planarization technique such as, for example, chemical mechanical planarization (CMP) and/or grinding is applied. The planarization technique removes excess conductive material of the top contact metal 136 from above the interlevel dielectric layer 122, the gate liner 120, and the top source drain regions 128. After polishing, upper surfaces of the top contact metal 136 are flush, or substantially flush, with upper surface of the interlevel dielectric layer 122, the gate liner 120, and the top source drain regions 128.

As illustrated in FIG. 11, the top contact metal 136 is embedded into the top source drain regions 128. Doing so increased the contact area between the top source drain regions 128 and the top contact metal 136 thereby reducing contact resistance. The contact area between a top source drain and a top contact of conventional devices is limited to the area of the uppermost surface of the top source drain. Here, the contact area between the top source drain regions 128 and the top contact metal 136 is equal to the surface area of the top contact metal 136, or the cumulative surface areas of all sidewalls of the top contact metal 136.

Figure 12:
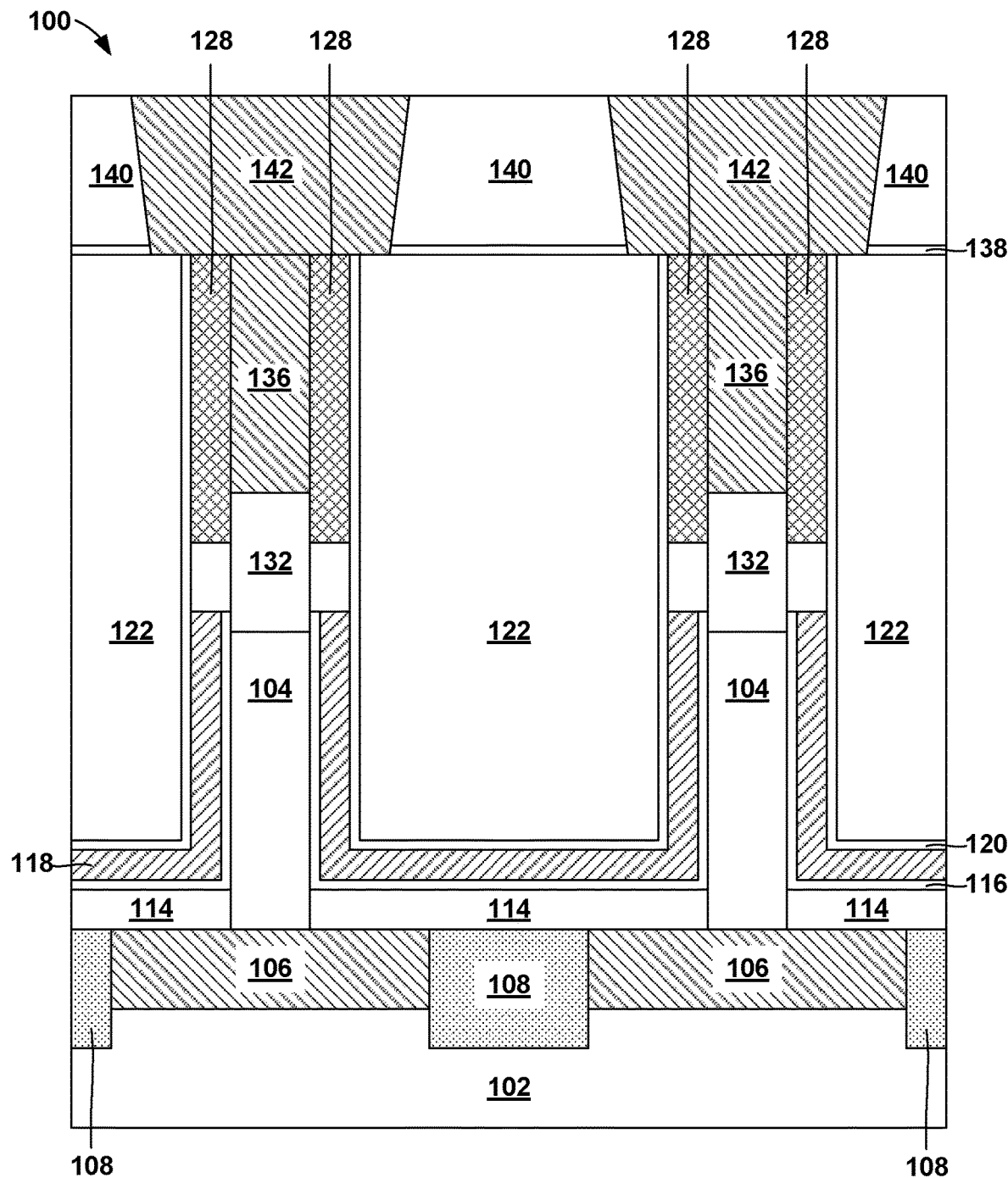
FIG. 12 is a cross-sectional view of the semiconductor structure after forming contact structures according to an exemplary embodiment.
Figure 13:
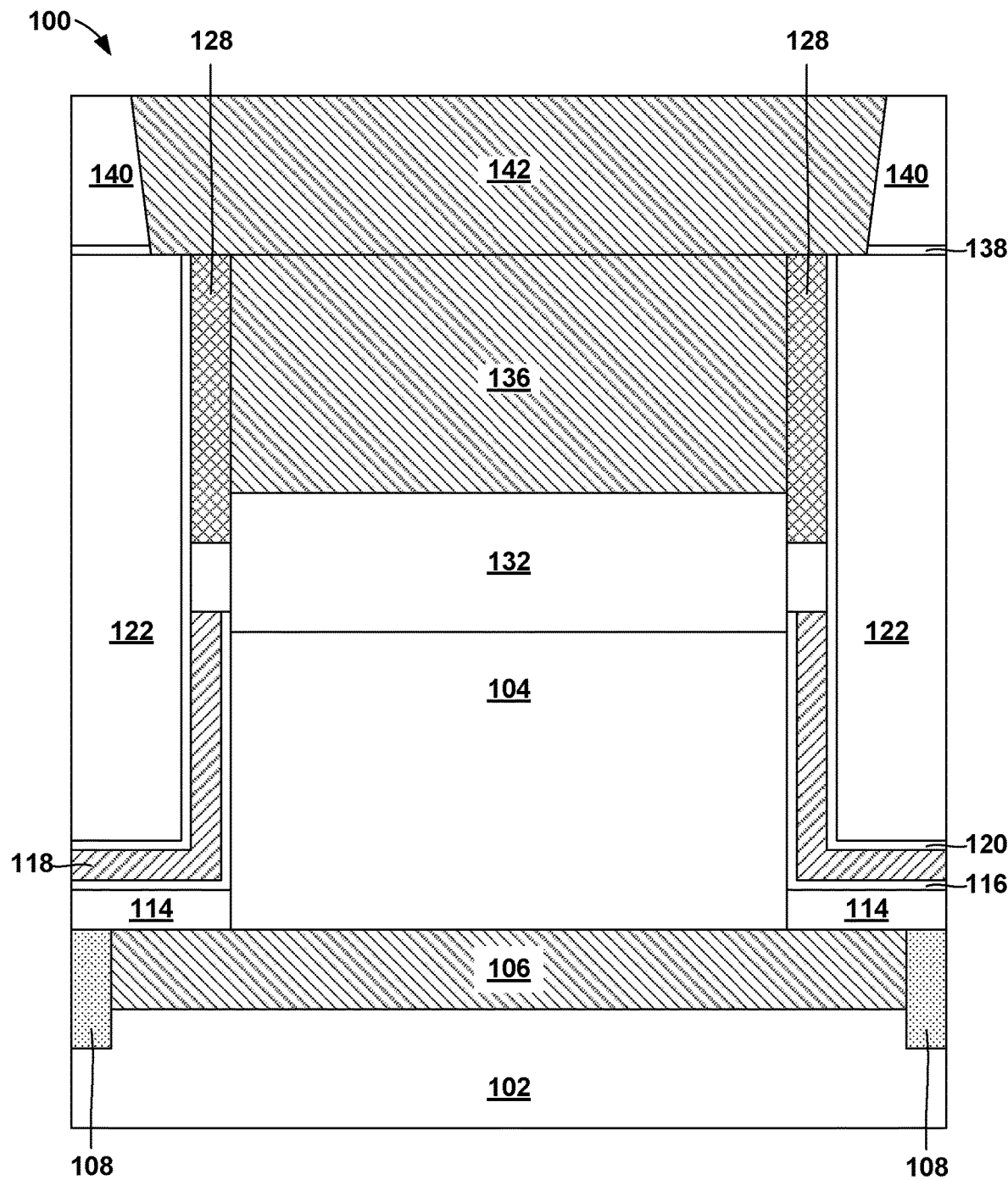
FIG. 13 is a cross-sectional view of FIG. 12 along the length of the fin according to an exemplary embodiment.

Referring now to FIG. 12, the structure 100 is shown after forming contact structures 142 in accordance with an embodiment of the present invention. First, an etch stop layer 138 is deposited on top of the structure 100 followed by another interlevel dielectric layer 140. Next, contact trenches are formed in the interlevel dielectric layer 140 and the etch stop layer 138, which expose upper surfaces of the gate liner 120, the top source drain regions 128, and the top contact metal 136. Finally, the contact trenches are filled with a conductive material to form the contact structures 142. The contact structures 142 can be formed by depositing a conductive material in the contact trench. As such, in at least one embodiment, the conductive material of the contact structures 142 is deposited directly on exposed upper surfaces of the gate liner 120, the top source drain regions 128, and the top contact metal 136. Furthermore, it is noted that a width of the top contact metal 136 (i.e. lower portion of the self-aligned top metal contact) is smaller than a width of contact structures 142 (i.e. upper portion of the self-aligned top metal contact).

The contact structures 142 may include any suitable conductive material, such as, for example, copper, aluminum, tungsten, cobalt, or alloys thereof. Examples of deposition techniques that can be used in providing the spacer material include, for example, chemical vapor deposition (CVD), plasma enhanced chemical vapor deposition (PECVD), or atomic layer deposition (ALD). In some cases, an electroplating technique can be used to form the contact structures 142.

After deposition, a planarization technique such as, for example, chemical mechanical planarization (CMP) and/or grinding is applied. The planarization technique removes excess conductive material of the contact structures 142 from above the additional interlevel dielectric layer 140. After polishing, upper surfaces of the contact structures 142 are flush, or substantially flush, with upper surface of the additional interlevel dielectric layer 140.

As illustrated in FIG. 12, the vertical transistor device represented by the structure 100 in this example has some distinctive notable features. For instance, the structure 100 includes a self-aligned top metal contact. More specifically, both the top contact metal 136 and the contact structures 142 make-up the self-aligned top metal contact. The self-aligned top metal contact is particularly beneficial because it reduces the external resistance and improves vertical device performance over conventional vertical device designs. More specifically, performance of conventional vertical device designs is limited by the external resistance at the top source drain region due to the difficulty in forming a large contact area between source drain epi (128) and the top contact (136/142). The self-aligned top metal contact proposed herein reduces the external resistance by greatly increasing the contact area between the top contact (136/140) and the top source drain regions 128, as discussed in detail above.

In practice, the contact area between the top source drain regions 128 and the top contact (136/142) can be as much as 1.5-2 times conventional devices. For example, the contact area between the top source drain regions 128 and the top contact (136/142) in the present invention involves the sidewalls and top surfaces of the top contact metal 136. In contrast, the contact area between a conventional top contact placed directly on a conventional top source drain region is limited to the surface area of that single interface.

For exemplary purposes only, assume each semiconductor fin 104 is 6 nm wide and 10 nm long, the gate dielectric 116 is 2 nm thick (wide), the metal gate 118 is 5 nm thick (wide), and the mask 110 is 15 nm tall. According to the present invention, the contact area between the top source drain regions 128 and the top contact (136/142) would be 500 $nm^2$, or (5+2+15+6+15+2+5)*10). In contrast, using the same dimensions, the contact area between a conventional top contact placed directly on a conventional top source drain region would be 200 $nm^2$, or (5+2+6+2+5)*10). In all cases, the contact area gain will be a function of the mask 110 height.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a bottom source drain region arranged on a substrate;
   a semiconductor channel region extending vertically upwards from a top surface of the bottom source drain region;
   a metal gate disposed around the semiconductor channel region;
   a top source drain region above the semiconductor channel region; and
   a top contact partially embedded into the top source drain region
   a dielectric spacer separating the metal gate from the top source drain region, wherein a width of the dielectric spacer is substantially equal to a width of the top source drain region.

2. The semiconductor structure according to claim 1, wherein a width of the top source drain region is substantially equal to a combined width of the metal gate and the gate dielectric.

3. The semiconductor structure according to claim 1, further comprising:
   a bottom spacer separating the bottom source drain region from the metal gate.

4. The semiconductor structure according to claim 1, wherein a width of a lower portion of the top contact is smaller than a width of an upper portion of the top contact.

5. The semiconductor structure according to claim 1, wherein a lower portion of the top contact is surrounded by the top source drain region and directly contacts a top surface of the semiconductor channel region.

6. The semiconductor structure according to claim 1, wherein a bottom surface of an upper portion of the top contact covers a top surface of the top source drain region.

7. The semiconductor structure according to claim 1, wherein a bottom surface of the top source drain region is below a top surface of the semiconductor channel region.

8. A semiconductor structure comprising:
   a bottom source drain region arranged on a substrate;
   a semiconductor channel region extending vertically upwards from a top surface of the bottom source drain region;
   a metal gate disposed around the semiconductor channel region;
   a top source drain region above the semiconductor channel region;
   a top contact partially embedded into the top source drain region, wherein sidewalls of the top contact are flush or substantially flush with sidewalls of the channel region; and
   a gate liner separating the metal gate and the top source drain from an interlevel dielectric layer, wherein an uppermost surface of the gate liner is substantially flush with an uppermost surface of the top source drain region.

9. The semiconductor structure according to claim 8, further comprising:
   a dielectric spacer separating the metal gate from the top source drain region.

10. The semiconductor structure according to claim 8, further comprising:
    a bottom spacer separating the bottom source drain region from the metal gate.

11. The semiconductor structure according to claim 8, wherein a width of a lower portion of the top contact is smaller than a width of an upper portion of the top contact.

12. The semiconductor structure according to claim 8, wherein a lower portion of the top contact is surrounded by the top source drain region and directly contacts a top surface of the semiconductor channel region.

13. The semiconductor structure according to claim 8, wherein a bottom surface of an upper portion of the top contact covers a top surface of the top source drain region.

14. The semiconductor structure according to claim 8, wherein a bottom surface of the top source drain region is below a top surface of the semiconductor channel region.

15. A method comprising:
    forming a bottom source drain region arranged on a substrate;
    forming a semiconductor channel region extending vertically upwards from a top surface of the bottom source drain region;
    forming a metal gate disposed around the semiconductor channel region;
    forming a dielectric spacer on the metal gate;
    forming a top source drain region above the semiconductor channel region, wherein the dielectric spacer separates the metal gate from the top source drain region; and
    forming a top contact partially embedded into the top source drain region.

16. The semiconductor structure according to claim 1, wherein a width of the top source drain region is substantially equal to a width of the metal gate plus a lateral width of the gate dielectric.

17. The method according to claim 15, further comprising:
    forming a bottom spacer separating the bottom source drain region from the metal gate.

18. The method according to claim 15, wherein a width of a lower portion of the top contact is smaller than a width of an upper portion of the top contact.

19. The method according to claim 15, wherein a lower portion of the top contact is surrounded by the top source drain region and directly contacts a top surface of the semiconductor channel region.

20. The method according to claim 15, wherein a bottom surface of an upper portion of the top contact covers a top surface of the top source drain region.

\* \* \* \* \*